(12) United States Patent
Krug, Jr. et al.

(10) Patent No.: US 9,504,184 B2
(45) Date of Patent: Nov. 22, 2016

(54) FLEXIBLE COOLANT MANIFOLD-HEAT SINK ASSEMBLY

(71) Applicant: INTERNATIONAL BUSINESS MACHINES CORPORATION, Armonk, NY (US)

(72) Inventors: Francis R. Krug, Jr., Highland, NY (US);
(Continued)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 14/620,459

(22) Filed: Feb. 12, 2015

(65) Prior Publication Data
US 2016/0242318 A1    Aug. 18, 2016

(51) Int. Cl.
*H05K 7/20* (2006.01)
*G06F 1/20* (2006.01)

(52) U.S. Cl.
CPC .................................. *H05K 7/20254* (2013.01)

(58) Field of Classification Search
CPC .................. H05K 7/20; H05K 7/20263; H05K 7/20272; H05K 7/20309; G06F 1/20;
(Continued)

(56) References Cited

U.S. PATENT DOCUMENTS 3,481,393 A * 12/1969 Chu ........................ F28F 3/12
                                                       165/104.31
4,771,366 A    9/1988 Blake et al.
(Continued)

FOREIGN PATENT DOCUMENTS

JP    2003-249783 A    9/2003
JP    2011-518395 A    6/2011
(Continued)

OTHER PUBLICATIONS

Grace Period Disclosure: Anonymous, "Cold Plate Manifold Hanger Tool", IP.com Publication No. 000235644 (Mar. 17, 2014) (3 pages).

(Continued)

*Primary Examiner* — Michail V Datskovskiy
(74) *Attorney, Agent, or Firm* — Margaret A. McNamara, Esq.; Kevin P. Radigan, Esq.; Heslin Rothenberg Farley & Mesiti P.C.

(57) ABSTRACT

A cooling assembly is provided which includes: one or more coolant-cooled heat sinks configured to couple to one or more electronic components to be cooled; one or more flexible coolant conduits; and one or more pivotable coolant manifolds. The flexible coolant conduit(s) couples in fluid communication the pivotable coolant manifold(s) and the coolant-cooled heat sink(s), and accommodates pivoting of the pivotable coolant manifold(s), while maintaining the coolant-cooled heat sink(s) in fluid communication with the pivotable coolant manifold(s). In one or more embodiments, the pivotable coolant manifold(s) pivots between a first position laterally offset from one or more of the coolant-cooled heat sink(s), and a second position above the one or more coolant-cooled heat sinks. First and second pivot arms may be provided at opposite ends of the pivotable coolant manifold(s) to facilitate pivotable movement of the manifold(s) between the first position and the second position.

17 Claims, 11 Drawing Sheets

(72) Inventors: Eric J. McKeever, Poughkeepsie, NY (US); Robert K. Mullady, Poughkeepsie, NY (US); Donald W. Porter, Highland, NY (US); Richard P. Snider, New Paltz, NY (US); John G. Torok, Poughkeepsie, NY (US); Allan C. VanDeventer, Poughkeepsie, NY (US); Xiaojin Wei, Poughkeepsie, NY (US)

(58) Field of Classification Search
CPC .............. H01L 23/34; H01L 23/467; H01L 23/473; F28F 7/00; F28D 15/00
USPC ......... 361/679.46, 679.53, 679.54, 688, 689, 361/698, 699, 701, 702, 703, 705–710, 361/715–724; 165/80.2, 80.4, 80.5, 104.14, 165/104.19, 104.33, 104.34, 185; 174/15.1, 174/16.3; 62/64, 59, 175, 259.2
See application file for complete search history.

(56) References Cited

U.S. PATENT DOCUMENTS

| | | | |
|---|---|---|---|
| 6,065,208 | A | 5/2000 | Lamb et al. |
| 6,125,035 | A | 9/2000 | Hood et al. |
| 6,134,106 | A | 10/2000 | Tao et al. |
| 6,477,773 | B1 | 11/2002 | Wilson et al. |
| 6,989,990 | B2 | 1/2006 | Malone et al. |
| 7,325,588 | B2 | 2/2008 | Malone et al. |
| 7,508,676 | B1 | 3/2009 | Samaniego et al. |
| 7,558,062 | B2 | 7/2009 | Wang et al. |
| 7,855,888 | B2 | 12/2010 | Peterson |
| 7,905,106 | B2 | 3/2011 | Attlesey |
| 7,911,793 | B2 | 3/2011 | Attlesey |
| 7,963,119 | B2 | 6/2011 | Campbell et al. |
| 7,965,509 | B2 * | 6/2011 | Campbell ............. H01L 23/473 165/104.33 |
| 8,922,998 | B2 | 12/2014 | Campbell et al. |
| 9,009,968 | B2 * | 4/2015 | Campbell .......... H05K 7/20272 165/164 |
| 2005/0128705 | A1 | 6/2005 | Chu et al. |
| 2005/0243517 | A1 | 11/2005 | Malone et al. |
| 2006/0067047 | A1 | 3/2006 | Pfahnl |
| 2008/0174962 | A1 | 7/2008 | Belady et al. |
| 2008/0212282 | A1 * | 9/2008 | Hall .......................... G06F 1/20 361/701 |
| 2010/0226106 | A1 | 9/2010 | Suarez et al. |
| 2011/0197612 | A1 | 8/2011 | Campbell et al. |
| 2013/0105116 | A1 | 5/2013 | Campbell et al. |
| 2013/0107457 | A1 * | 5/2013 | Campbell .......... H05K 7/20272 361/699 |

FOREIGN PATENT DOCUMENTS

| | | |
|---|---|---|
| WO | 2010/036237 A1 | 4/2010 |
| WO | 2013063250 A1 | 5/2013 |

OTHER PUBLICATIONS

Cannistra et al., "Module Board Service Frame", IBM Technical Disclosure Bulletin, vol. 22, No. 2 (Jul. 1979) (2 pages).
Pascuzzo et al., "Integrated Circuit Module Package Cooling Structure", IP.com Publication No. 000068903 (Feb. 20, 2005) (3 pages).
Anonymous, "DIMM Array Liquid Cooling Structure with FRU-Ability Features", IP.com Publication No. 000168297 (Mar. 5, 2008) (3 pages).
Campbell et al., International Search Report for PCT/US2012/061895 (PCT Publication No. WO 2013/063250 A1), dated Mar. 18, 2013 (2 pages).
Krug, Jr. et al., "Flexible Coolant Manifold—Heat Sink Assembly", U.S Appl. No. 15/185,704, filed Jun. 17, 2016 (41 pages).
Krug, Jr. et al., List of IBM Patents and Patent Applications Treated as Related, U.S. Appl. No. 14/620,459, filed Feb. 12, 2015, dated Jun. 20, 2016 (2 pages).

* cited by examiner

FLEXIBLE COOLANT MANIFOLD-HEAT SINK ASSEMBLY

STATEMENT REGARDING PRIOR DISCLOSURE(S) PURSUANT TO 35 U.S.C. §102(b)(1)(A)

The following disclosure is submitted under 35 U.S.C. §102(b)(1)(A): "Cold Plate Manifold Hanger Tool", disclosed anonymously, IP.com Electronic Publication, Mar. 17, 2014, IP.com Publication No. 000235644, pages 1-2.

BACKGROUND

The power dissipation of integrated circuit chips, and the modules containing the chips, continues to increase in order to achieve increases in processor performance. This trend poses a cooling challenge at both the module and system levels. Increased airflow rates are needed to effectively cool high power modules and to limit the temperature of the air that is exhausted into the computer center.

In many large server applications, processors along with their associated electronics (e.g., memory, disk drives, power supplies, etc.) are packaged in removable drawer configurations stacked within a rack or frame. In other cases, the electronics may be in fixed locations within the rack or frame. Typically, the components are cooled by air moving in parallel airflow paths, usually front-to-back, impelled by one or more air moving devices (e.g., axial or centrifugal fans). In some cases it may be possible to handle increased power dissipation within a single drawer by providing greater airflow, through the use of a more powerful air moving device or by increasing the rotational speed (i.e., RPMs) of an existing air moving device. However, this approach is becoming problematic at the rack level in the context of a computer installation or data center.

In some cases, the sensible heat load carried by the air exiting the rack is stressing the capability of the room air-conditioning to effectively handle the load. This is especially true for large installations with "server farms" or large banks of computer racks located close together. In such installations, liquid cooling (e.g., water cooling) is an attractive technology to manage the higher heat fluxes. The liquid absorbs the heat dissipated by the components/modules in an efficient manner, with the heat typically being transferred from the liquid to an outside environment, whether air or other liquid.

BRIEF SUMMARY

In one aspect, provided herein is a cooling assembly which includes: at least one coolant-cooled heat sink to couple to at least one electronic component to be cooled, one coolant-cooled heat sink of the at least one coolant-cooled heat sink comprising at least one coolant-carrying channel; at least one flexible coolant conduit, one flexible coolant conduit of the at least one flexible coolant conduit being coupled in fluid communication with the at least one coolant-carrying channel of the one coolant-cooled heat sink; and at least one pivotable coolant manifold, the one coolant-cooled conduit coupling in fluid communication one pivotable coolant manifold of the at least one pivotable coolant manifold with the one coolant-cooled heat sink of the at least one coolant-cooled heat sink, and the one flexible coolant conduit accommodating pivoting of the one coolant-cooled manifold, while maintaining the one coolant-cooled heat sink in fluid communication with the one pivotable coolant manifold.

In another aspect, a cooled electronic system is provided which includes an electronic system, having multiple electronic components to be cooled, and a cooling assembly associated with the electronic system. The cooling assembly includes: multiple coolant-cooled heat sinks coupled to the multiple electronic components to be cooled; multiple flexible coolant conduits coupled in fluid communication with the multiple coolant-cooled heat sinks to facilitate flow of liquid coolant therethrough; and a pivotable coolant supply manifold and a pivotable coolant return manifold. The pivotable coolant supply manifold and the pivotable coolant return manifold are pivotably moveable between a respective first position and a respective second position, wherein the multiple flexible conduits couple in fluid communication the pivotable coolant supply manifold and the multiple coolant-cooled heat sinks, and couple in fluid communication the multiple coolant-cooled heat sinks and the pivotable coolant return manifold to facilitate flow of liquid coolant through the multiple coolant-cooled heat sinks. The multiple flexible coolant conduits accommodate pivoting of the pivotable coolant supply manifold and the pivotable coolant return manifold between their respective first position and second position.

In a further aspect, a method is provided which includes providing a cooling assembly for facilitating cooling of at least one electronic component of an electronic system. The providing includes: providing at least one coolant-cooled heat sink to couple to the at least one electronic component to be cooled, one coolant-cooled heat sink of the at least one coolant-cooled heat sink comprising at least one coolant carrying channel; providing at least one flexible coolant conduit, one flexible coolant conduit of the at least one flexible coolant conduit being in fluid communication with the at least one coolant carrying channel of the one coolant-cooled heat sink; and providing at least one pivotable coolant manifold, the one flexible coolant conduit coupling in fluid communication one pivotable coolant manifold of the at least one pivotable coolant manifold with the one coolant-cooled heat sink, and the one flexible coolant conduit accommodating pivoting of the one pivotable coolant manifold, while maintaining the one coolant-cooled heat sink in fluid communication with the one pivotable coolant manifold.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

In a conventional air-cooled data center, multiple electronics racks may be disposed in one or more rows, with the data center housing several hundred, or even several thousand, microprocessors within the electronics racks. Note that "electronics rack", "rack unit", "rack", "information technology (IT) infrastructure", etc., may be used interchangeably herein, and unless otherwise specified, include any housing, frame, support, structure, compartment, etc., having one or more heat-generating components of a computer system, electronic system, IT system, etc.

In an air-cooled data center, cooled air typically enters the data center via perforated floor tiles from a cool air plenum defined between a raised floor and a base or subfloor of the data center. Cooled air is taken in through air inlet sides of the electronics racks and expelled through the back or air outlet sides of the racks. Each electronics rack may have, for instance, one or more axial or centrifugal fans to provide inlet-to-outlet airflow to cool the electronic components within the one or more electronic systems of the electronics rack. The supply air plenum conventionally provides cooled and conditioned air to the air inlet sides of the electronics rack via perforated floor tiles disposed in a "cold" aisle of the data center, with the cooled and conditioned air being supplied to the plenum by one or more air-conditioning units, which are also typically disposed within the data center. Room air is taken into the air-conditioning units near an upper portion thereof. This room air may comprise, in part, exhausted air from the "hot" aisle(s) of the data center defined, for instance, by opposing air outlet sides of adjacent rows of electronics racks.

Figure 1:
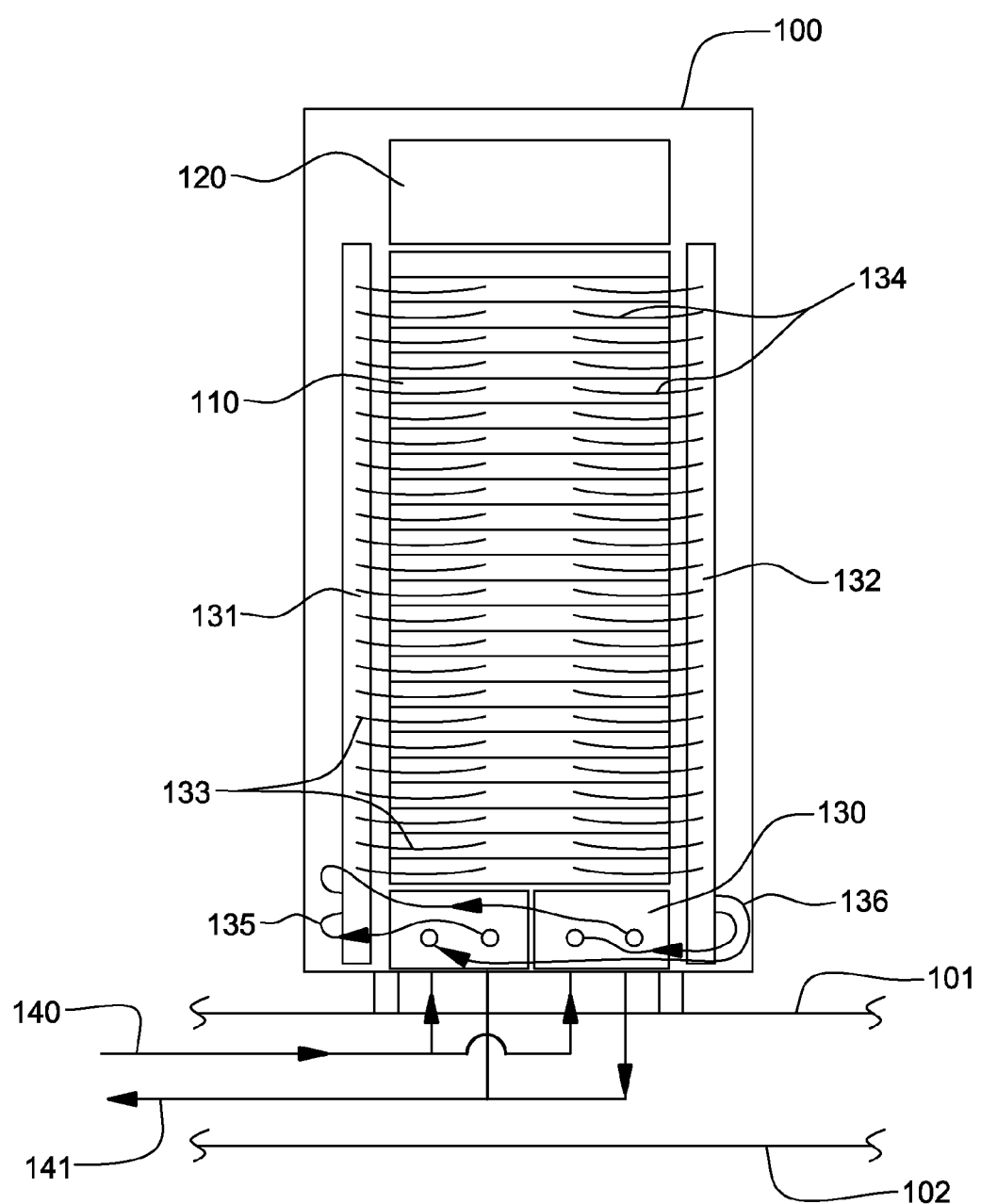
FIG. 1 is an elevational view of one embodiment of an at least partially coolant-cooled electronics rack comprising multiple electronic systems with cooling assemblies, in accordance with one or more aspects of the present invention.

Due to ever-increasing airflow requirements through electronics racks of a data center, and the limits of air distribution within the typical data center installation, liquid-assisted cooling may be desirable in combination with conventional air-cooling. FIG. 1 depicts one embodiment of an at least partially coolant-cooled electronics rack with one or more cooling assemblies (not shown), comprising one or more coolant-cooled heat sinks coupled to high-heat-generating electronic components, being disposed within the electronic systems or nodes of the electronics rack. Note that reference is made herein to the drawings, which are not necessarily drawn to scale to facilitate an understanding of the invention, where the same reference numbers used throughout different figures designate the same or similar components.

Referring to FIG. 1, an at least partially coolant-cooled electronics rack 100 may include, in one example, a plurality of electronic systems or nodes 110, which may be or comprise processor or server nodes. A bulk power regulator 120 may be disposed, for instance, in an upper portion of coolant-cooled electronics rack 100, and one or more coolant-conditioning units (CCUs) 130 may be disposed at a lower portion of the coolant-cooled electronics rack. In the embodiments described herein, the coolant may be a liquid coolant, such as water or an aqueous-based solution by way of example.

In addition to CCUs 130, the cooling system of coolant-cooled electronics rack 100 includes, by way of example, a rack-level coolant supply manifold 131, a rack-level coolant return manifold 132, and manifold-to-node fluid connect hoses 133 coupling rack-level coolant supply manifold 131 to one or more cooling assemblies within one or more electronic systems 110, and node-to-manifold fluid connect hoses 134 coupling the individual cooling assemblies within electronic systems 110 to rack-level coolant return manifold 132. Each CCU 130 is in fluid communication with rack-level coolant supply manifold 131 via a respective system coolant supply hose 135, and each CCU 130 is in fluid communication with rack-level coolant return manifold 132 via a respective system coolant return hose 136.

As illustrated, and by way of example only, a portion of the heat load of electronic systems 110 within electronics rack 100 may be transferred from the system coolant to, for instance, cooler facility coolant supplied via a facility coolant supply line 140 and a facility coolant return line 141 disposed, in the illustrated embodiment, in the space between a raised floor 101 and a base floor 102 of the data center housing the at least partially coolant-cooled electronics rack 100.

As explained further herein, cooling assemblies are provided, with one or more coolant-cooled heat sinks (or coolant-cooled cold plates) within electronic systems 110 of coolant-cooled electronics rack 100. The coolant-cooled heat sinks may be coupled to high-heat-generating electronic components of the electronic system, such as, for instance, processor modules. Heat is removed from the respective high-heat-generating electronic components via system coolant circulating through the coolant-cooled heat sinks within a system coolant loop defined by the coolant-conditioning units 130, rack-level manifolds 131, 132, and cooling assemblies within the individual electronic systems 110, which include the coolant-cooled heat sinks coupled to the electronic components being cooled. The system coolant loop and coolant-conditioning unit(s) may be designed to provide system coolant of a controlled temperature and pressure, as well as controlled chemistry and cleanliness to the coolant-cooled heat sinks coupled to the electronic components. In one or more embodiments, the system coolant may be maintained physically separate from the less-controlled facility coolant in, for instance, facility coolant supply and return lines 140, 141, to which heat may be ultimately transferred. Note that alternate heat dissipation implementations are also possible. For instance, the coolant-conditioning units 130 could be configured with one or more coolant-to-air heat exchangers to facilitate dissipating heat from the system coolant to an airflow passing through the coolant-conditioning units, for instance, from the air inlet side to the air outlet side of coolant-cooled electronics rack 100.

Figure 2:
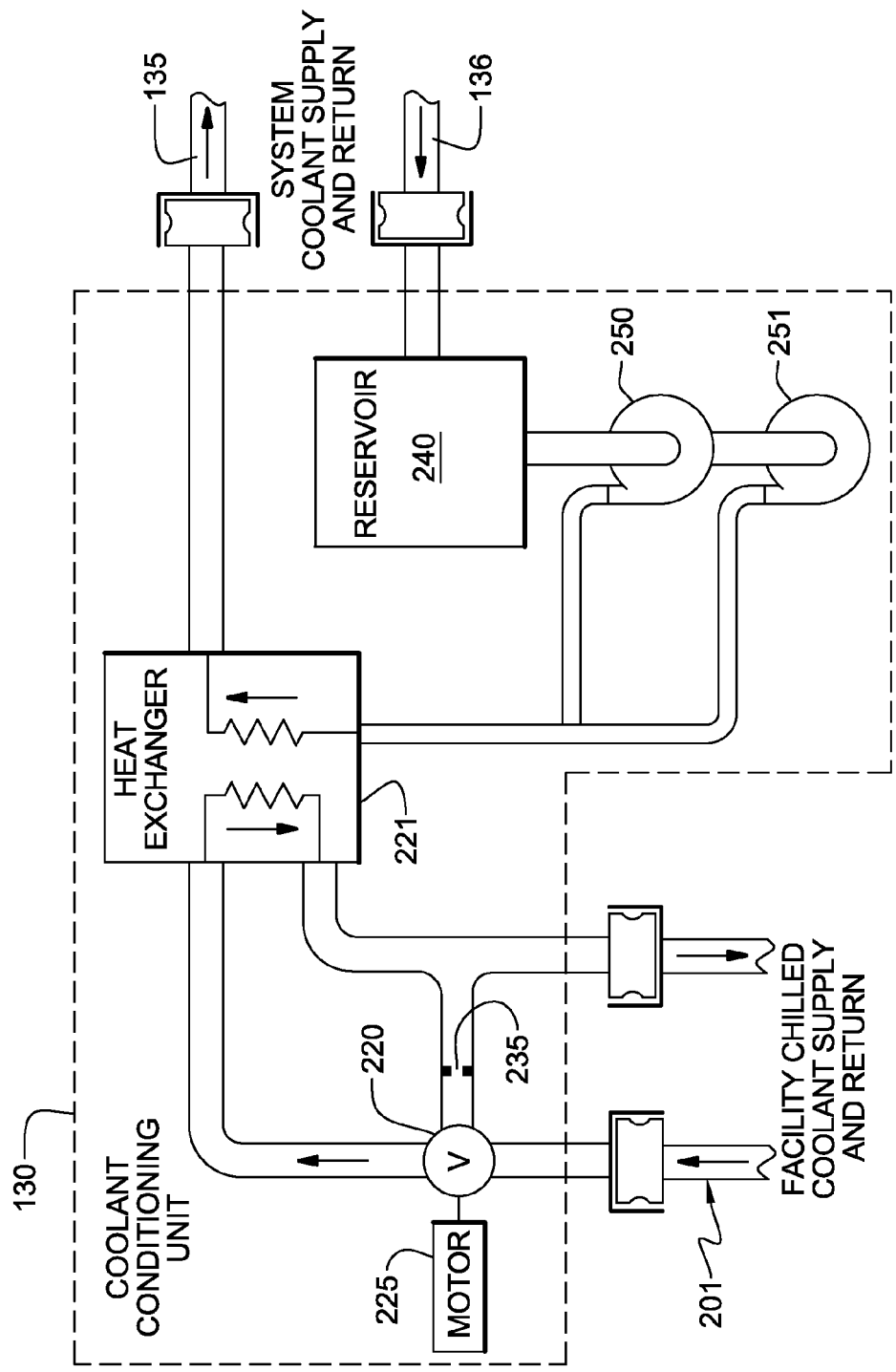
FIG. 2 is a schematic of one embodiment of a coolant-conditioning unit for one implementation of a coolant-cooled electronics rack such as depicted in FIG. 1, in accordance with one or more aspects of the present invention.

FIG. 2 depicts one embodiment of a coolant-conditioning unit 130. As shown, in one or more implementations, coolant-conditioning unit 130 includes a first coolant loop, wherein chilled facility coolant 201 is supplied and passes through a control valve 220 driven by a motor 225. Control valve 220 determines an amount of facility coolant to be passed through to a coolant-to-coolant heat exchanger 221, with a portion of the facility coolant possibly being returned directly via a bypass orifice 235. The coolant-conditioning unit 130 further includes a second coolant loop with a reservoir tank 240 from which system coolant is pumped, either by pump 250 or redundant pump 251, into coolant-to-coolant heat exchanger 221, for conditioning and output thereof, as cooled system coolant to the cooling assemblies within the electronic systems of the coolant-cooled electronics rack. For instance, the cooled system coolant may be supplied to the above-described rack-level coolant supply manifold, and be returned via the rack-level coolant return manifold of FIG. 1, using system coolant supply hose 135 and system coolant return hose 136.

Recent server system designs and architectures continue to drive the need for enhanced cooling approaches and structures to be developed to cool, for instance, higher-power processor chips or modules. An example of high-power processor chips or modules which may benefit from active liquid cooling include the System Z® Central Electronic Complex (CEC) processor modules offered by International Business Machines Corporation of Armonk, N.Y. By way of example, the electronic system to be cooled may be disposed in one or more horizontal drawer configurations comprising multiple distributed processor, single-chip modules (SCMs). The modules may be liquid coolant-cooled, such as water-cooled, via a liquid cooling system such as discussed above in connection with FIGS. 1 & 2, and an appropriate intra-drawer or intra-node manifold-heat sink assembly.

By way of example, in one or more implementations, an appropriate intra-drawer or intra-node manifold-heat sink assembly may be a rigid structure, comprising rigid connect tubing. However, a rigid tube manifold-heat sink assembly with inflexible connect tubing coupling the intra-drawer manifolds and heat sinks, cannot be easily manipulated into place when first assembling the cooled electronic system(s). Further, a rigid tube manifold-heat sink assembly would need to be removed as a whole assembly if, for instance, one of the single-chip modules (SCMs) required servicing or replacement. Further, tight mechanical clearances in a cooled electronic system such as described herein, in which the system or drawer is tightly packed, could potentially result in damage to the rigid tube manifold-heat sink assembly, or surrounding components on the motherboard of the system when the manifold-heat sink assembly is being installed or removed. Although the entire rigid tube manifold-heat sink assembly could be fabricated as a field-replaceable unit (FRU), the cost for stocking and handling such a large field-replaceable unit could, disadvantageously, be in the multi-million dollar range.

Further, in one or more electronic system layouts, the coolant-cooled heat sinks may be located at a relatively low point in the drawer cooling circuit, potentially creating drainage issues. Residual water in the cooling circuit could lead to freeze damage issues within the cooling loop, for instance, if the system is shipped in below freezing conditions. If water remains within the coolant loop, the use of rigid conductive tubes could result in a frozen "plug" being created in the tubes attached to the heat sinks, potentially causing an increase in pressure as the water in the more massive heat sinks freezes. The pressure and expanding ice could, for instance, deform the heat sink's thermal interface surface, impacting its heat transfer properties, or compromise the rigid tube wall(s), resulting in a coolant leak upon thawing. Methods of removing the coolant from a manifold-heat sink assembly are available, such as applying high-pressure air, removing and rotating the cooled electronic system drawer, removing the manifold-heat sink assembly, and rotating the assembly to drain the coolant, etc., but typically have issues in implementation. For instance, a high-pressure air source may not be available in all situations, such as within a data center environment, and removal of the drawer or manifold-heat sink assembly could be both time-consuming and potentially dangerous, possibly requiring special tools and procedures, which might not be compatible with many operating data center environments. As another solution, antifreeze chemicals could be incorporated into the coolant to inhibit the coolant from freezing. However, the added chemicals may degrade heat transfer, and therefore be an unacceptable option, depending on the anticipated heat load and environmental conditions.

Presented herein, therefore, is a flexible coolant manifold-heat sink assembly with multiple points of flexibility. For instance, flexible coolant conduits are employed to couple the rigid coolant-cooled heat sinks of the assembly to the rigid drawer- or node-level coolant supply and return manifolds using, for example, hose barb fittings and hose clamps. The flexible coolant conduits are fabricated and sized to provide a flexible manifold-heat sink assembly design which allows for controlled movement of portions of the assembly, for instance, to allow access to selected areas of the electronic system board requiring servicing. Additionally, the use of flexible coolant conduits with insulative properties, in addition to providing flexibility in movement of the individual heat sinks, also provides flexible-walled, insulative conduits, which provide expansion areas should coolant volume increase, for instance, in the associated heat sink(s), as ice is formed. This advantageously facilitates the flexible coolant manifold-heat sink assembly surviving freeze conditions without damage to the assembly. Specifically, in one or more embodiments, the associated heat sinks may be fabricated of metal such that any coolant within the heat sinks will freeze first, before coolant in the flexible-walled, insulative conduits, allowing for expansion to occur within the conduits, without damage to the metal heat sinks.

Generally stated, provided herein is a cooling assembly, referred to as a flexible coolant manifold-heat sink assembly, which includes one or more coolant-cooled heat sinks or cold plates configured to couple to one or more electronic components to be cooled. The coolant-cooled heat sinks include one or more coolant-carrying channels through which coolant, such as water or an aqueous-based coolant, is circulated to facilitate removal of heat generated by the electronic component(s) when the heat sink(s) is operatively coupled thereto. The cooling assembly further includes flexible coolant conduits coupling the coolant-cooled heat sink(s) to one or more drawer- or node-level pivotable coolant manifolds of the assembly. By way of example, a pivotable coolant supply manifold and a pivotable coolant return manifold may be provided, with the multiple flexible coolant conduits coupling in fluid communication the pivotable coolant manifolds and the coolant-cooled heat sinks. The size and construction of the coolant-cooled conduits is such as to permit pivotable movement of the manifolds as desired, for instance, to access components of the electronic system beneath the manifolds. Advantageously, the flexible coolant conduits accommodate pivoting of the pivotable coolant manifold(s), while maintaining the coolant-cooled heat sink(s) in fluid communication with the pivotable coolant manifold(s), and keeping the coolant-cooled heat sink(s) in thermal and mechanical contact with the electrical component(s).

In one or more implementations, the pivotable coolant manifold(s) pivots between a first position and a second position. By way of example, the first position may be laterally offset from one or more of the coolant-cooled heat sinks, and the second position may be above the one or more coolant-cooled heat sinks. In the first position, when the cooling assembly is operatively associated with the electronic components to be cooled, access to the coolant-cooled heat sink is accommodated by releasing and lifting the heat sink, bending back the flexible coolant conduit(s) coupled thereto. Additionally, in the second position, the pivotable coolant manifold(s) may be substantially directly over the one or more coolant-cooled heat sinks, with the flexible coolant conduit(s) being straight, or straighter than when the manifold(s) is in the first position. In one or more embodiments, the coolant-cooled heat sinks may be disposed in a single row, and where so, the pivotable coolant manifolds may be disposed over the heat sinks when in the second position. Pivoting the pivotable coolant manifold(s) to the second position may facilitate, for instance, access to one or more components of the electronic system disposed beneath the pivotable coolant manifold when the manifold(s) is in the first position. If disposed in multiple rows, then the manifolds may be pivoted between being located over different rows, or to a position over one or more of the rows of heat sinks, for instance, in the second position.

As explained further below, the flexible coolant manifold-heat sink assembly may include, in one or more embodiments, a first pivot arm and a second pivot arm disposed at opposite ends of the pivotable coolant manifold(s). The first and second pivot arms facilitate pivotable movement of the pivotable coolant manifold(s), and may be designed to couple or attach to the electronic system (or a structure associated therewith) comprising the electronic components to be cooled. For instance, the first and second pivot arms could each be structured with a base member which facilitates fastening of the pivot arm to an electronic system housing, or a motherboard of the electronic system on opposite ends of the high-heat-generating electronic components to be actively cooled. Further, one or both of the first and second pivot arms may include a spring-biased latch mechanism for selectively latching or unlatching the pivotable coolant manifold(s) when in at least one of the first position or the second position. For instance, when a pivotable coolant supply manifold and pivotable coolant return manifold are pivotably lifted to the second position, then (in one embodiment) the latch mechanism(s) may be engaged to latch the pivotable manifolds in the second position, and thus allow service personnel hands-free access to one or more components underlying the assembly when the pivotable coolant supply and return manifolds are in their first position. Note that, in one or more implementations, the pivotable coolant supply and return manifolds may be coupled to pivot together using the first and second pivot arms disposed at the opposite ends thereof. In addition, one or more lift brackets may be physically attached to the pivotable manifolds to facilitate, for instance, manipulation, or pivotable movement, of the manifolds between their respective first and second positions using an appropriate tool configured to engage the lift bracket(s).

Figure 3A:
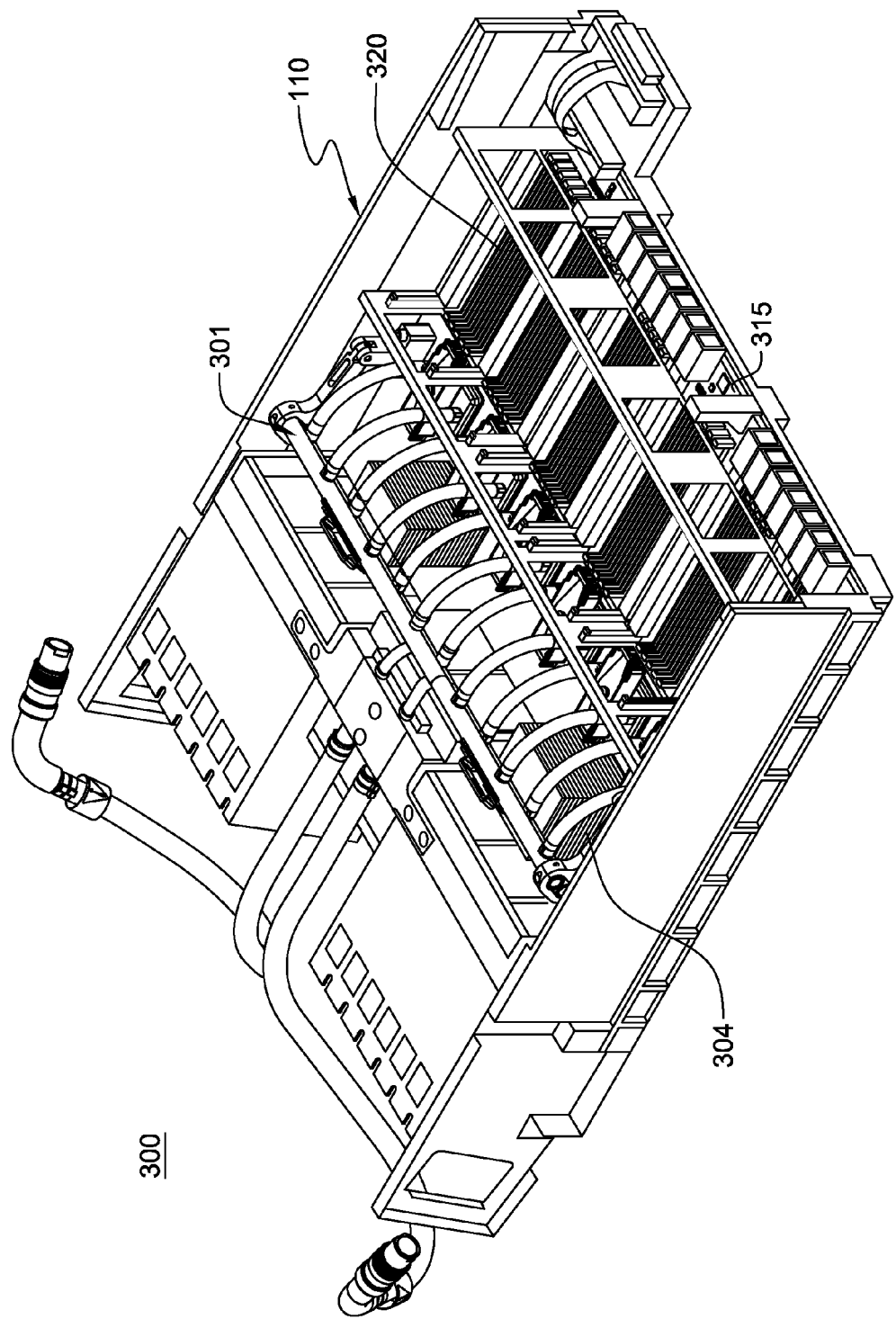
FIG. 3A depicts one embodiment of a partially assembled electronic system and cooling assembly layout, wherein the electronic system includes six heat-generating electronic components to be actively cooled by the cooling assembly, in accordance with one or more aspects of the present invention.
Figure 3B:
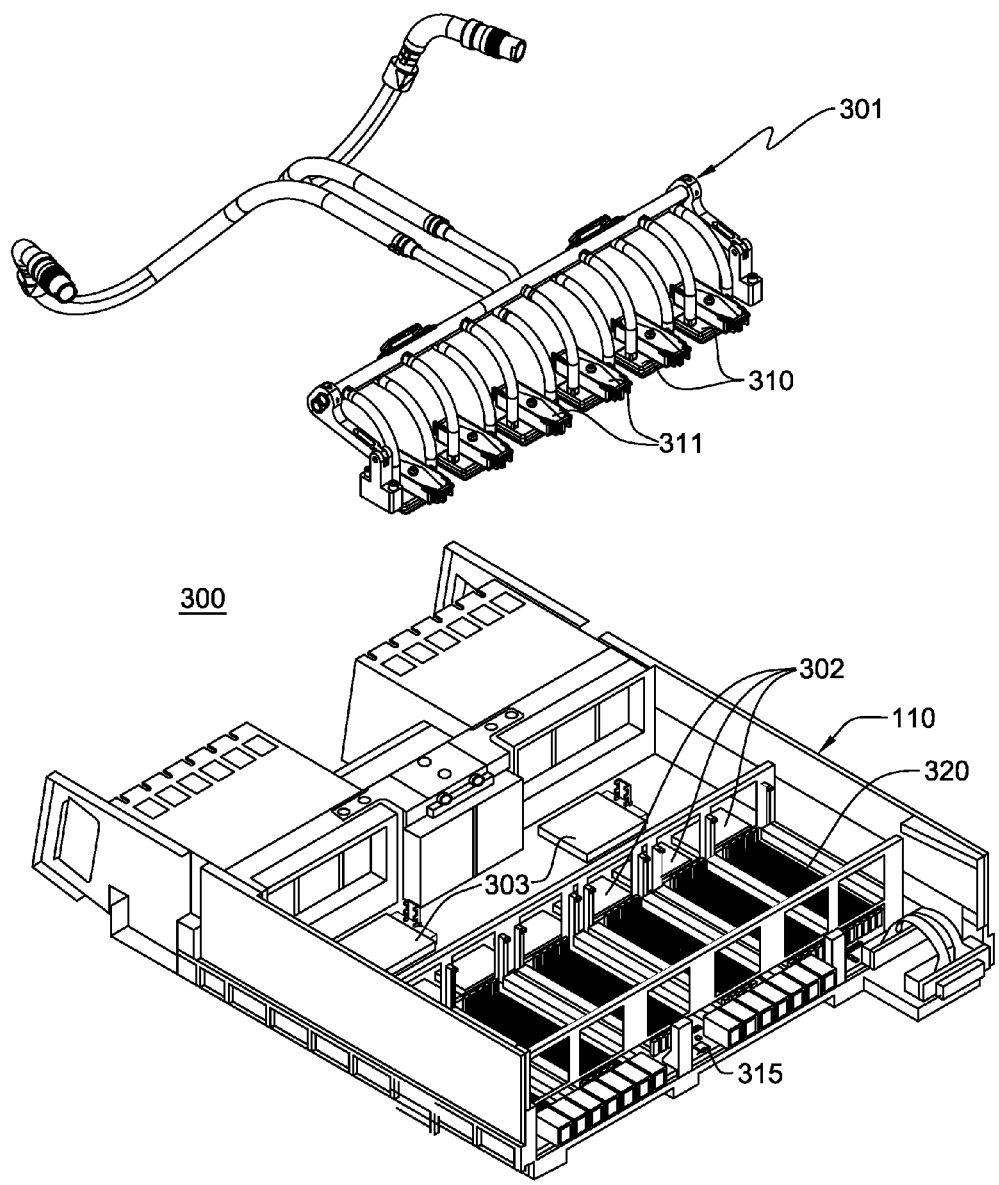
FIG. 3B depicts the electronic system and cooling assembly layout of FIG. 3A, with the cooling assembly shown exploded from the electronic system, in accordance with one or more aspects of the present invention.

FIGS. 3A & 3B depict one embodiment of a cooled electronic system 300, in accordance with one or more aspects of the present invention. By way of example, cooled electronic system 300 includes electronic system 110, such as the above-described drawer- or node-level electronic system of FIG. 1, and a flexible coolant manifold-heat sink assembly 301 coupled thereto, in accordance with one or more aspects of the present invention. In this implementation, flexible coolant manifold-heat sink assembly 301 is a drawer- or node-level cooling assembly with multiple coolant-cooled heat sinks 310, each configured and sized to attach to and cool a respective electronic component 302, such as a respective high-heat-generating electronic component of a server node. In one example, respective loading brackets 311 may be provided to facilitate secure attachment and loading of coolant-cooled heat sinks 310 to electronic components 302 to ensure good thermal conduction from electronic components 302 to coolant-cooled heat sinks 310.

As one detailed example, the exemplary electronic system of FIGS. 3A & 3B may comprise an electronics drawer or planar server assembly, which includes a multilayer printed circuit board to which memory sockets and various electronic components to be cooled are attached, both physically and electrically. As illustrated, electronic system 110 may include a support substrate or planar board 315, a plurality of memory module sockets 320 (e.g., dual in-line memory module sockets), as well as high-heat-generating processor modules 302, and other components 303, such as memory support modules, which produce less heat and may be air-cooled.

By way of example only, in one or more implementations, one or more other components 303 of electronic system 110 may be air-cooled by an airflow established using one or more air-moving devices (not shown) within electronic system 110, or the electronics rack housing the system. As illustrated in FIG. 3A, the one or more other components 303 to be air-cooled may have one or more air-cooled heat sinks 304 physically coupled thereto. Note that in the particular embodiment depicted, flexible coolant manifold-heat sink assembly 301 includes a pivotable coolant supply manifold and pivotable coolant return manifold disposed in a first, operational position in FIG. 3A, laterally offset from the row of coolant-cooled heat sinks 310, but overlying the one or more other components 303 of electronic system 110, such as one or more single-chip modules to which air-cooled heat sinks 304 are coupled.

Figure 4:
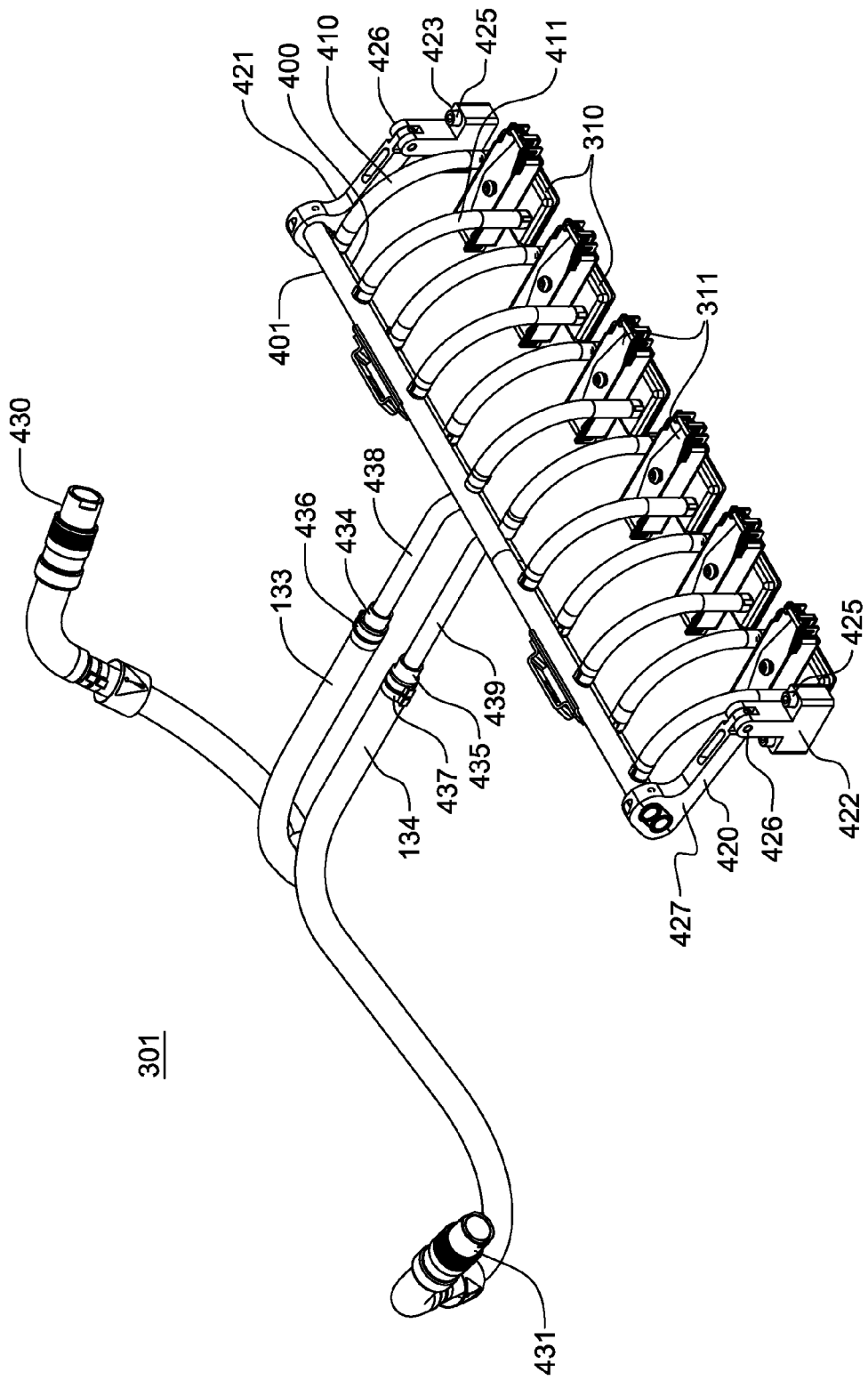
FIG. 4 is an enlarged view of the cooling assembly of FIGS. 3A & 3B, in accordance with one or more aspects of the present invention.

FIG. 4 depicts an enlarged view of one embodiment of flexible coolant manifold-heat sink assembly 301, in accordance with one or more aspects of present invention. Note that this implementation of cooling assembly 301 is a drawer- or node-level implementation designed to reside within an electronic system chassis of, for instance, one or more electronic system chassis within an electronics rack. As illustrated, in addition to multiple coolant-cooled heat sinks 310, flexible coolant manifold-heat sink assembly 301 includes a pivotable coolant supply manifold 400 and a pivotable coolant return manifold 401, which are coupled in this embodiment at opposite ends to a first pivot arm 420 and a second pivot arm 421. Flexible coolant supply conduits 410 and flexible coolant return conduits 411 couple, in the illustrated example, each coolant-cooled heat sink 310 in fluid communication with pivotable coolant supply manifold 400 and pivotable coolant return manifold 401 to allow for flow of liquid coolant, such as the above-described system coolant, through the heat sinks to facilitate extraction of heat generated by the associated electronic components to which the heat sinks are coupled, as discussed above in connection with FIGS. 3A & 3B. Note that, by way of example, each coolant-cooled heat sink 310 has a flexible coolant supply conduit 410 and a flexible coolant return conduit 411 coupled thereto for direct supply and return of coolant through the coolant-cooled heat sink. Thus, in the illustrated embodiment, liquid coolant flows in parallel through the heat sinks between the pivotable coolant supply manifold 400 and pivotable coolant return manifold 401.

As noted, respective loading brackets 311 may be provided to facilitate a good thermal interface and good thermal conduction between coolant-cooled heat sinks 310 and the associated electronic components 302 (FIG. 3B) to be cooled. Flexible coolant supply conduits 410 and flexible coolant return conduits 411 are, in one embodiment, fabricated of a flexible, insulative material, such as rubber, and are of sufficient length to couple rigid coolant-cooled heat sinks 310 to pivotable coolant supply manifold 400 and pivotable coolant return manifold 401, via appropriate hose barb fittings and hose clamps. Note that the length of each coolant supply conduit 410 and flexible coolant return conduit 411 is also sufficient to allow for pivotable movement of the rigid pivotable coolant supply manifold 400 and rigid pivotable coolant return manifold 401 between a first position, illustrated in FIG. 4, and a second position illustrated, by way of example, in FIG. 7A. Note in this regard that the first and second pivot arms 420, 421 include respective base members for 422, 423 which facilitate fastening of the first and second pivot arms to, for instance, a structure associated with the electronic system comprising the electronic components to be cooled. For instance, the first and second pivot arms 420, 421 could be affixed using mechanical fasteners 425 to the support substrate or planar system board in the example of FIGS. 3A & 3B. Note also, in the example depicted in FIG. 4, first and second pivot arms 420, 421 align with the row of coolant-cooled heat sinks 310, and include a pivot axis 426 at upper ends of base members 422, 423, about which pivot elements 427 of the first and second pivot arms 420, 421, pivot. In the example depicted, the pivot axis 426 is at an elevated height above the row of coolant-cooled heat sinks 310, and pivotable coolant supply manifold 400 and pivotable coolant return manifold 401 are at an elevation higher than the coolant-cooled heat sinks when installed within the associated electronic system.

Flexibility is further achieved in the cooling assembly disclosed herein using flexible manifold-to-node fluid connect hoses 133, 134 to connect flexible coolant manifold-heat sink assembly 301 to, for instance, rack-level coolant supply and return manifolds, respectively (see FIGS. 1 & 2). In one or more implementations, respective quick connect couplings 430, 431 at the ends of flexible manifold-to-node fluid connect hoses 133, 134 may be provided, and rigid tube extensions 438, 439 may respectively extend from pivotable coolant supply manifold 400 and pivotable coolant return manifold 401 and facilitate coupling of flexible manifold-to-node fluid connect hoses 133, 134 to the corresponding pivotable coolant supply and return manifolds using, for instance, respective hose barb fittings 434, 435 and hose clamps 436, 437. Note that, in one implementation, pivoting of pivotable coolant supply and return manifolds 400, 401 may be facilitated by providing flexible manifold-to-node fluid connect hoses 133, 134 with sufficient length to allow for transition of the pivotable coolant supply and return manifolds 400, 401 between their respective first and second positions, as described herein. Alternatively, the respective quick connect couplings 430, 431 with poppets may be disengaged from, for instance, the rack-level coolant supply and return manifolds (FIG. 1) prior to pivoting of the pivotable coolant supply and return manifolds 400, 401 from the illustrated first position to their second position.

Figure 7A:
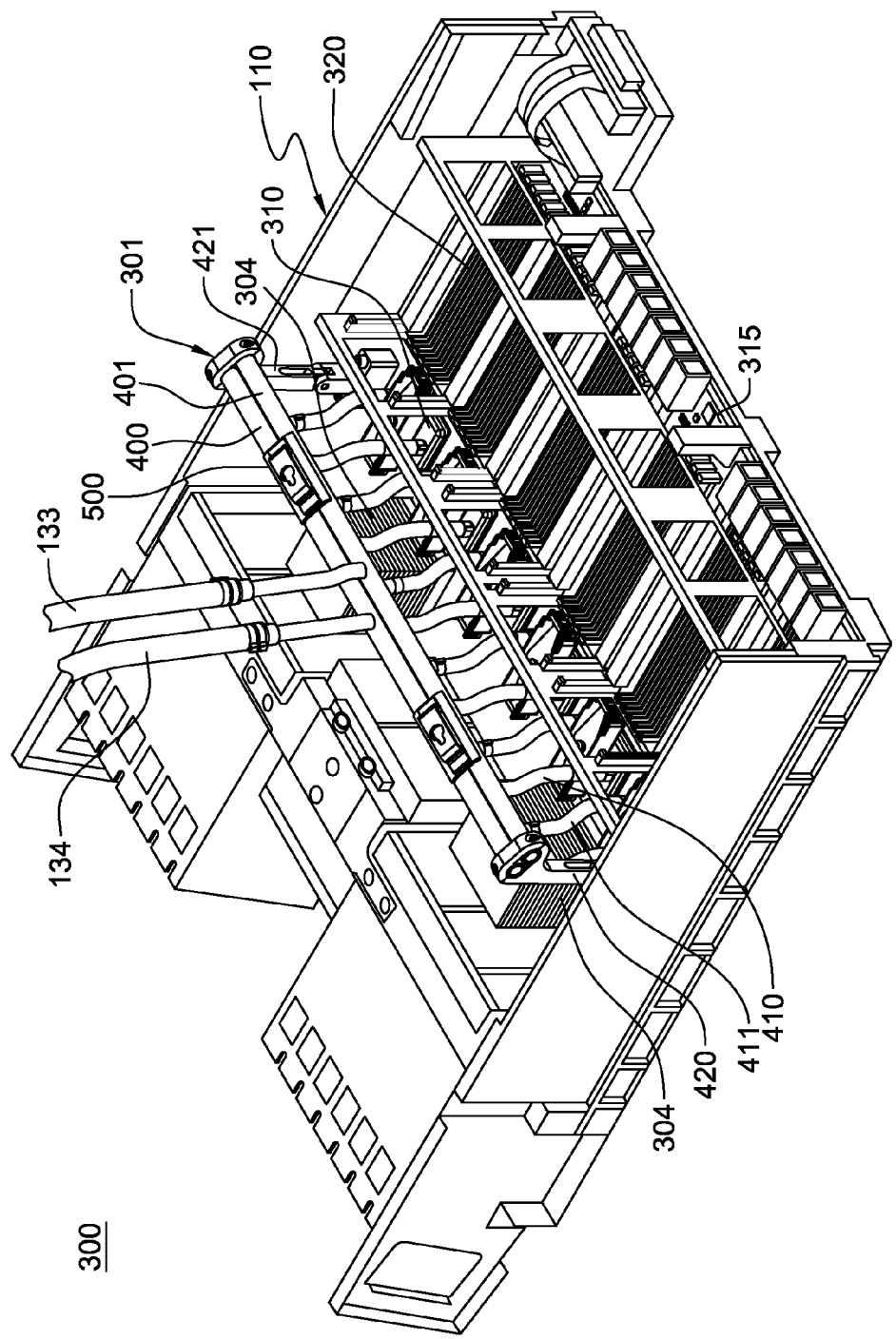
FIG. 7A depicts the electronic system and cooling assembly layout of FIG. 3A, with the cooling assembly manifolds pivoted to a second position, where the pivotable coolant supply and return manifolds are disposed above one or more of the coolant-cooled heat sinks to, for instance, allow access to electronic components under the cooling assembly manifolds in the first position, in accordance with one or more aspects of the present invention.

By way of example, and as illustrated in FIGS. 3A & 4, pivotable coolant supply and return manifolds 400, 401 may be in a first position to, for instance, facilitate inclusion of the cooling assembly within the electronic system housing, drawer, chassis, etc., and operational insertion of the resultant cooled electronic system within the respective electronics rack. From this position, flexible coolant supply and return conduits 410, 411, and (in one or more embodiments) flexible manifold-to-node fluid connect hoses 133, 134 allow for pivoting of pivotable coolant supply and return manifolds 400, 401 to a second position, as discussed further below. Note that the particular first and second positions illustrated herein in FIGS. 3A & 7A are provided by way of example only. Note also that the in-line, six electronic component and six coolant-cooled heat sink example of FIGS. 3A-4 is provided as one example only of the concepts disclosed herein.

Advantageously, the flexible coolant manifold-heat sink assembly presented herein provides an operator with the ability to move portions of the assembly, without disturbing the remaining portions, or in many cases, the fluid connections of the assembly. This enables field personnel to readily replace, for instance, a defective heat sink, or underlying electronic component, at the data center housing the associated electronics rack, without requiring field stocking, transportation, or replacement of an entire electronic system and cooling assembly drawer. Also, collateral damage to neighboring components is minimized or avoided, with movement of the individual heat sinks being more manageable without contacting other hardware components of the electronic system. Ease of installation at the factory also facilitates fabricating new cooled electronic systems, which aides in providing defect-free assemblies, and similarly, minimizes need for entire assembly replacement if a particular cooling assembly defect is identified at the factory. For coolant removal, and the avoidance of freeze-related issues, the flexible coolant manifold-heat sink assembly disclosed herein has advantages over, for instance, a rigid tube assembly approach, in that it is more robust and tolerant of residual coolant freeze expansion. Component damage may advantageously be avoided due to the insulation properties of the flexible coolant conduits, and their expandable interaction with the attached metal components during a freeze process.

Figure 5A:
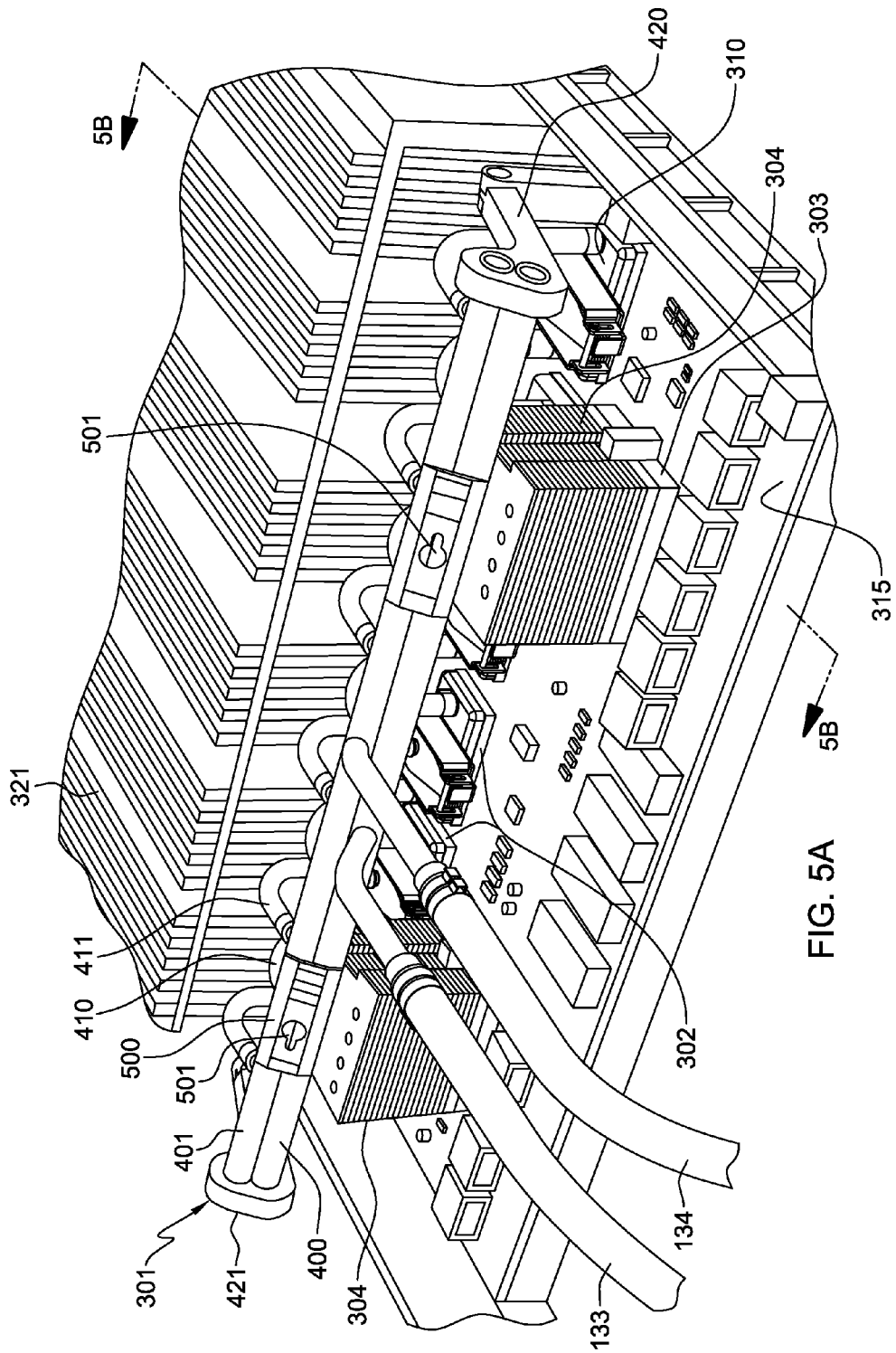
FIG. 5A is a partial enlarged view of the electronic system and cooling assembly layout of FIG. 3A, with the pivotable coolant supply and return manifolds of the cooling assembly shown in a first position, in accordance with one or more aspects of the present invention.
Figure 5B:
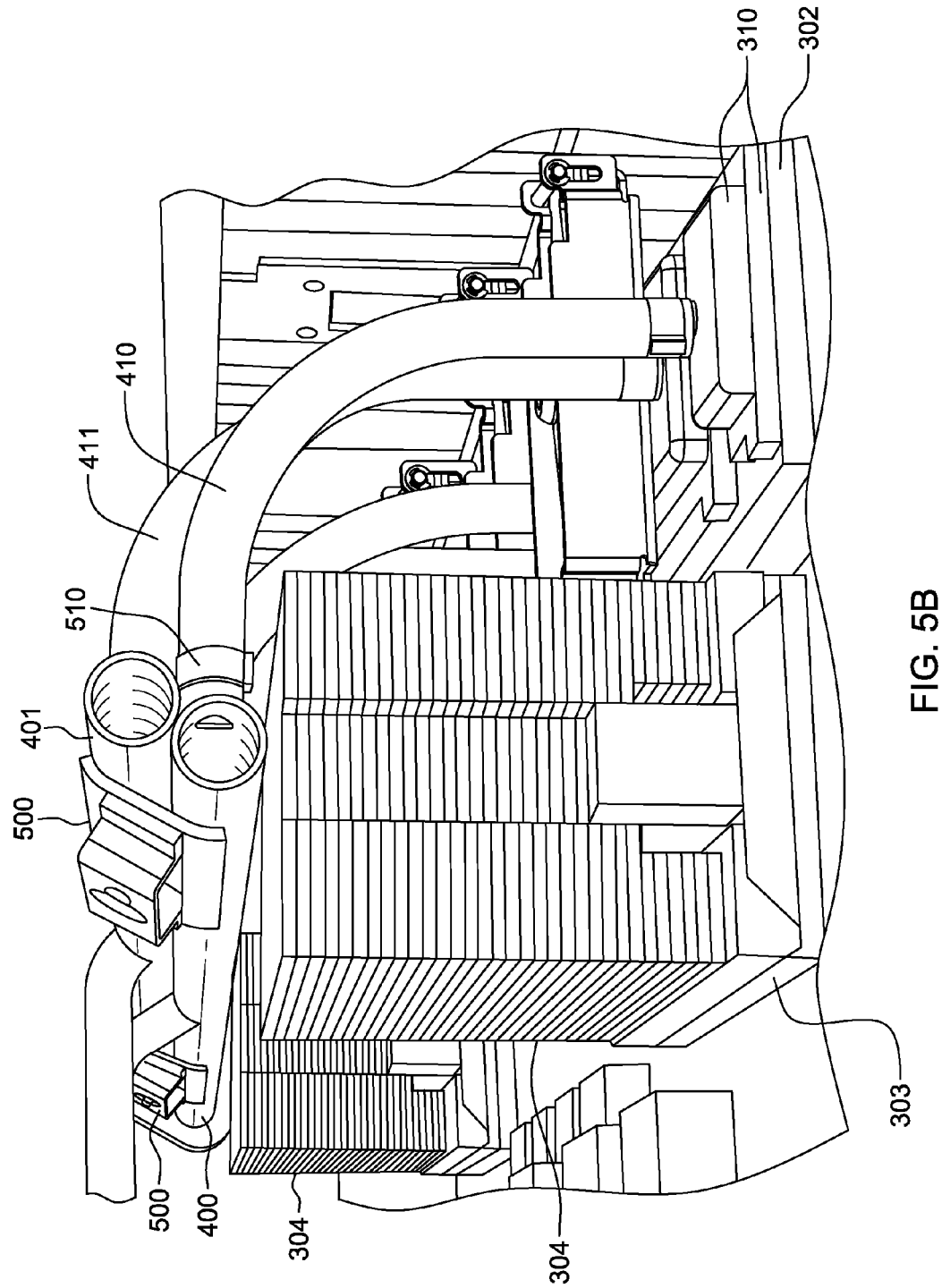
FIG. 5B is a partial enlarged cross-sectional view of the electronic system and cooling assembly layout of FIG. 5A, taken along line 5B-5B thereof, in accordance with one or more aspects of the present invention.

FIGS. 5A & 5B further illustrate one embodiment of flexible coolant manifold-heat sink assembly 301 with pivotable coolant supply manifold 400 and pivotable coolant return manifold 401 shown in a first position overlying, by way of example, air-cooled heat sinks 304 coupled to and facilitating cooling of electronic components 303. Note again that this particular configuration is provided by way of example only of the concepts presented. In this configuration, first and second pivot arms 420, 421 may be configured to allow pivotable coolant supply manifold 400 to approach, or even physically contact, upper surfaces of air-cooled heat sinks 304 to minimize the vertical profile of the flexible coolant manifold-heat sink assembly when in the first, operational position depicted. This minimizing of vertical profile facilitates operative positioning of the cooled electronic system housing or chassis within the respective electronics rack, shown by way of example in FIG. 1.

In the partial cutaway, enlarged view of FIG. 5B, flexible coolant conduits 410, 411 respectively couple in fluid communication pivotable coolant supply and return manifolds 400, 401, and the coolant-cooled heat sinks 310. Fluid-tight connections are obtained using, for instance, hose barb fittings and hose clamps 510. As noted, in the first position illustrated in FIGS. 5A & 5B, flexible coolant conduits 410, 411 are bent, with the pivotable coolant supply manifold 400 and pivotable coolant return manifold 401 laterally offset from coolant-cooled heat sinks 310, and their associated heat-generating electronic components 302.

One or more brackets 500 may be attached to pivotable coolant supply and return manifolds 400, 401 to, for example, facilitate pivotable movement of the manifolds from the depicted first position of FIGS. 5A & 5B to a second position, attainable by pivoting first and second pivot arms 420, 421, as illustrated in FIG. 7A. Brackets 500 may include, for instance, respective key slots 501, which may be engaged by a tool (not shown) configured to facilitate an operator's movement of the pivotable coolant supply and return manifolds 400, 401 between the first and second positions of the cooling assembly.

In one or more alternate embodiments, rather than having one or more air-cooled heat sinks below pivotable coolant supply and return manifolds 400, 401, other components, such as other electronic components of the electronic system, could be positioned below the manifolds, when in the first position illustrated in FIGS. 5A & 5B. Further, depending on the cooling system, rather than being disposed closer to a front edge of the electronic system, the pivotable coolant supply and return manifolds 400, 401 in the first position could be collapsed closer to a back edge of the electronic system depending, for instance, on the particular implementation of the liquid-cooled electronics rack. Note in this regard that the front of the electronic rack refers to, for instance, the air inlet side of the electronics rack, with the back refers to the air outlet side thereof.

Figure 6A:
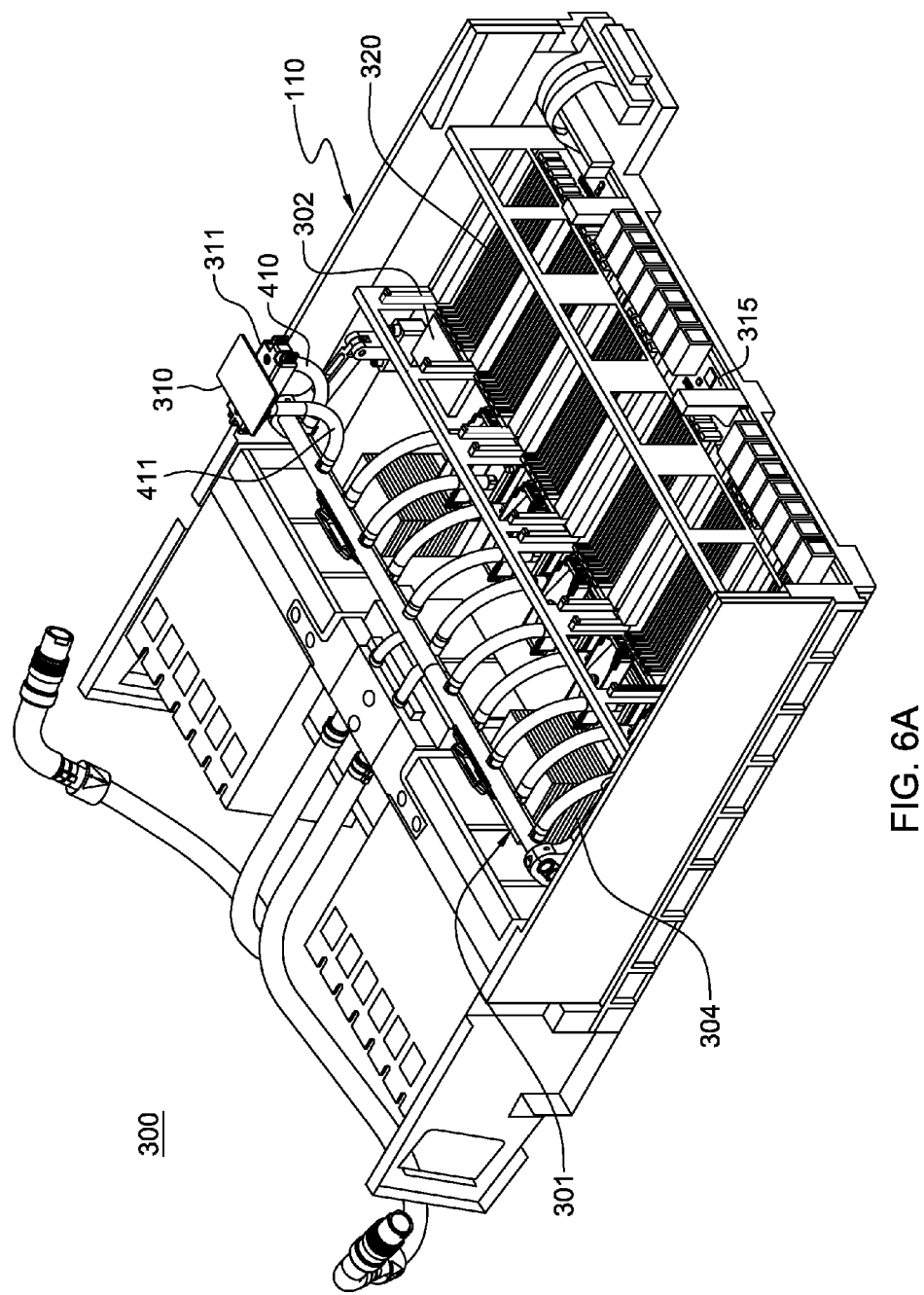
FIG. 6A illustrates the electronic system and cooling assembly layout of FIG. 3A, with the manifolds of the cooling assembly shown in the first position, and with one coolant-cooled heat sink shown decoupled from its associated electronic component and lifted to, for instance, allow access to the associated electronic component, in accordance with one or more aspects of the present invention.
Figure 6B:
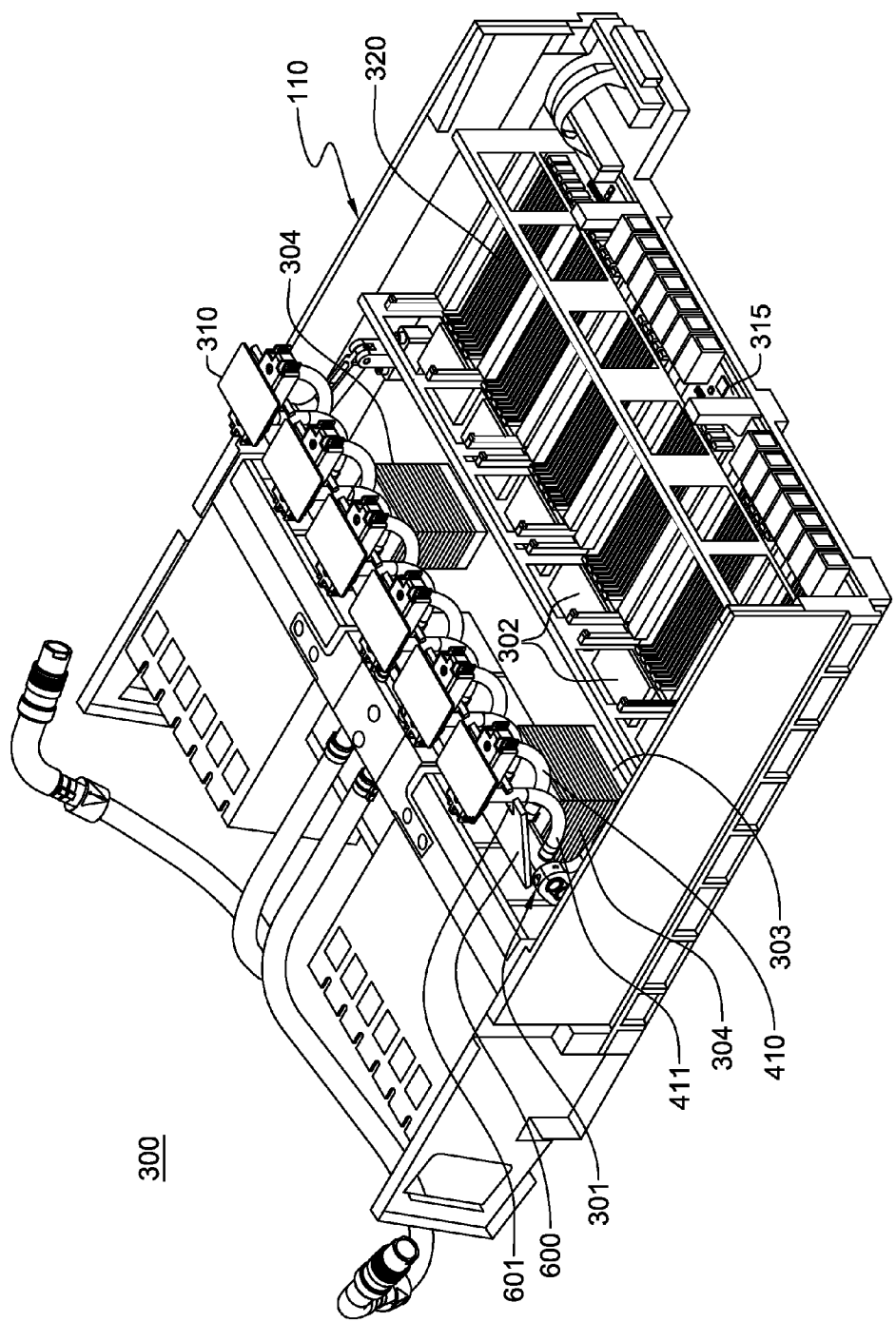
FIG. 6B depicts the electronic system and cooling assembly layout of FIG. 3A with, by way of example, all six coolant-cooled heat sinks decoupled from their electronic components, and lifted back, to allow access to the electronic components, while still maintaining the pivotable coolant manifolds and coolant-cooled heat sinks of the cooling assembly coupled in fluid communication, in accordance with one or more aspects of the present invention.

FIGS. 6A & 6B depict lift-off of a single, coolant-cooled heat sink 310, and all coolant-cooled heat sinks 310, respectively, from engagement with the underlying electronic components 302 being cooled. In FIG. 6A, upon disengagement of the respective loading bracket 311, an operator may simply lift and bend back the particular coolant-cooled heat sink 310, for instance, to facilitate repair of that coolant-cooled heat sink 310, or its loading bracket 311, or to facilitate access to the underlying heat-generating electronic component 302, for instance, to replace the electronic component, without disengaging or otherwise affecting connections of the flexible coolant manifold-heat sink assembly 301.

In FIG. 6B, a tool 600, such as an appropriately sized plate tool with conduit-receiving slots 601 may be provided as part of the cooling assembly approach disclosed herein to facilitate holding multiple coolant-cooled heat sinks 310 in a lifted-back position, disengaged from their respective electronic components 302 to be cooled. By way of example, each coolant-cooled heat sink 310 could be disengaged and lifted back, with the flexible coolant conduits 410, 411 inserted into the respective conduit slots 601 to hold the conduits in place while allowing for hands-free access to the underlying electronic components 302, as well as system board 315 in the region of the underlying electronic components 302. Note that, in one or more embodiments of the present invention, any number, including all coolant-cooled heat sinks, are able to be disengaged and bent back to accommodate operator access to the underlying electronic components, without requiring decoupling of the respective flexible coolant conduits 410, 411 connecting in fluid communication the coolant-cooled heat sinks and the pivotable coolant supply and return manifolds.

FIG. 7A depicts, by way of example, the pivotable coolant supply and return manifolds 400, 401 pivoted to a second position, with the manifolds disposed above the coolant-cooled heat sinks 310 to allow for operator access to one or more components, such as air-cooled heat sinks 304 underlying the pivotable coolant supply and return manifolds 400, 401 when in the first position. Note that pivoting of the manifolds to the second position may be facilitated by decoupling the quick connect couplings 430, 431 (FIG. 4) at the ends of the rack-level, manifold-to-node fluid connect hoses 133, 134 (FIG. 4), and removing the cooled electronic system housing or chassis from the respective electronics rack. In this manner, service personnel can readily access the one or more components underlying the cooling assembly in the first position, without decoupling cooling system connections within the cooled electronic system itself.

Figure 7B:
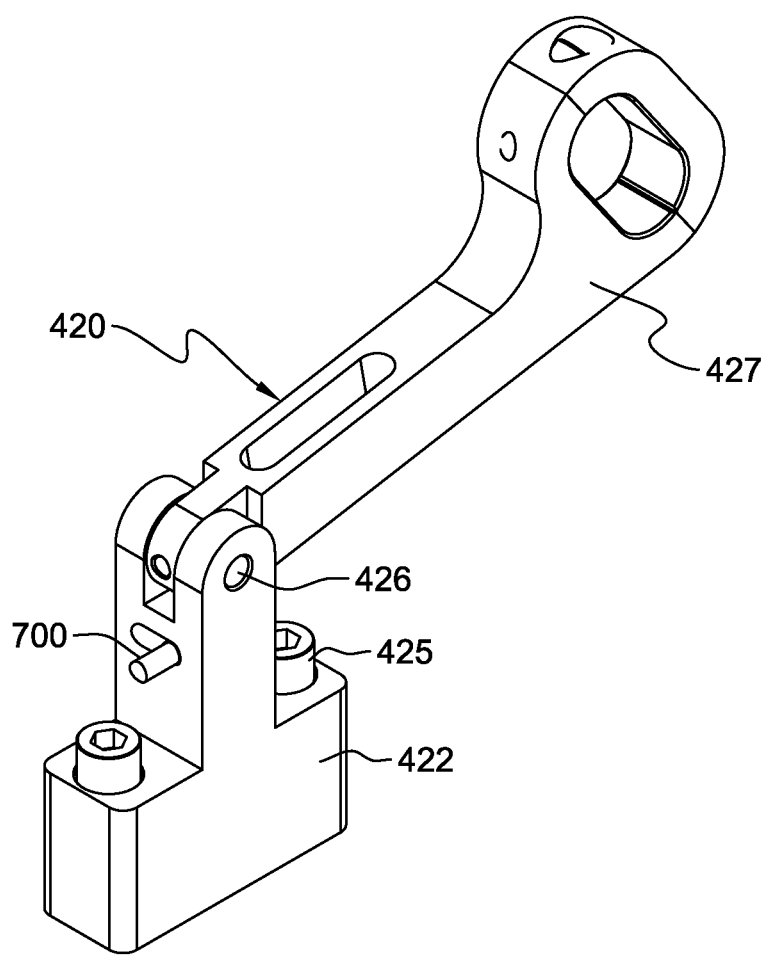
FIG. 7B is an enlarged view of one embodiment of a pivot arm of the cooling assembly of FIGS. 3A & 7A, and illustrates a latch release lever for, for instance, disengaging the pivot arm from the second position, for return of the pivotable coolant supply and return manifolds to their respective first position, in accordance with one or more aspects of the present invention.

As shown in FIG. 7B, one or both of the first and second pivot arms 420, 421 (FIG. 7A) may be provided with a latch mechanism, and a release tab 700 which facilitates, for instance, latching of the first and second pivot arms 420, 421 in the second position depicted in FIG. 7A, to maintain the cooling assembly in the second position illustrated without operator assistance. Pivoting from the second position, back to the operational, first position of the flexible coolant manifold-heat sink assembly may be achieved by service personnel actuating release tab 700 to disengage the latch mechanism of the pivot arms to allow collapsing or pivoting of the manifolds back to the first position.

By way of example, in one or more embodiments, the latch mechanism may comprise a sliding cylindrical pin, residing in a slotted hole in base member 422 into which is attached release tab 700. A spring inserted into the hole, under the pin, loads the pin when assembled, and would drive the pin into a hole located in the upper pivot arm 427 to latch. Tab 700 is used to disengage the pin from the latch hole, and reload the spring.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A cooling assembly comprising:
   at least one coolant-cooled heat sink to couple to at least one electronic component to be cooled, one coolant-cooled heat sink of the at least one coolant-cooled heat sink comprising at least one coolant-carrying channel;
   at least one flexible coolant conduit, one flexible coolant conduit of the at least one flexible coolant conduit being in fluid communication with the at least one coolant-carrying channel of the one coolant-cooled heat sink;
   at least one pivotable coolant manifold, the one flexible coolant conduit coupling in fluid communication one pivotable coolant manifold of the at least one pivotable coolant manifold with the one coolant-cooled heat sink, and the one flexible coolant conduit accommodating pivoting of the one pivotable coolant manifold, while maintaining the one coolant-cooled heat sink in fluid communication with the one pivotable coolant manifold; and
   wherein the at least one pivotable coolant manifold pivots between a first position laterally offset from the one coolant-cooled heat sink and a second position above the one coolant-cooled heat sink, and in the first position, when the cooling assembly is operatively associated with the at least one electronic component, access to the one coolant-cooled heat sink is accommodated.

2. The cooling assembly of claim 1, wherein the one flexible coolant conduit is bent with the at least one pivotable coolant manifold in the first position, and is straighter with the at least one pivotable coolant manifold in the second position.

3. The cooling assembly of claim 1, further comprising a first pivot arm and a second pivot arm, the first pivot arm and the second pivot arm being disposed at opposite ends of the at least one pivotable coolant manifold and facilitating pivotable movement of the at least one pivotable coolant manifold, the first pivot arm and the second pivot arm to couple to an electronic system, or associated structure, comprising the at least one electronic component to be cooled.

4. The cooling assembly of claim 3, wherein at least one of the first pivot arm or the second pivot arm comprises a latch mechanism for latching the at least one pivotable coolant manifold in one of a first position or a second position, the at least one pivotable coolant manifold being pivotable between the first position and the second position.

5. The cooling assembly of claim 3, wherein the at least one pivotable coolant manifold is pivotable between a first position laterally offset from the one coolant-cooled heat sink and a second position above the one coolant-cooled heat sink, and wherein in the first position, when the cooling assembly is operatively associated with the at least one electronic component, access to the one coolant-cooled heat sink is accommodated.

6. The cooling assembly of claim 1, further comprising:
   multiple coolant-cooled heat sinks to couple to multiple electronic components to be cooled, the at least one coolant-cooled heat sink being at least one coolant-cooled heat sink of the multiple coolant-cooled heat sinks, and the at least one electronic component being at least one electronic component of the multiple electronic components to be cooled;
   multiple flexible coolant conduits coupled in fluid communication with the multiple coolant-cooled heat sinks, the at least one flexible coolant conduit being at least one flexible coolant conduit of the multiple flexible coolant conduits; and
   multiple pivotable coolant manifolds, the at least one pivotable coolant manifold being at least one pivotable coolant manifold of the multiple pivotable coolant manifolds, and the multiple flexible coolant conduits coupling in fluid communication the multiple pivotable coolant manifolds with the multiple coolant-cooled heat sinks, and wherein the multiple pivotable coolant manifolds comprise a pivotable coolant supply manifold and a pivotable coolant return manifold, the pivotable coolant supply manifold and the pivotable coolant return manifold pivoting between a respective first position laterally offset from the one coolant-cooled heat sink, and a respective second position above the one coolant-cooled heat sink.

7. The cooling assembly of claim 6, wherein the multiple flexible coolant conduits comprise a plurality of flexible coolant supply conduits and a plurality of flexible coolant return conduits, the plurality of flexible coolant supply conduits coupling in fluid communication the pivotable coolant supply manifold to the multiple coolant-cooled heat sinks, and the plurality of flexible coolant return conduits coupling in fluid communication the multiple coolant-cooled heat sinks and the pivotable coolant return manifold.

8. The cooling assembly of claim 6, further comprising a first pivot arm and a second pivot arm, the first pivot arm and the second pivot arm being disposed at opposite ends of the pivotable coolant supply manifold and the pivotable coolant return manifold, and facilitating pivotably moving together the pivotable coolant supply manifold and the pivotable coolant return manifold, the first pivot arm and the second pivot arm being configured to couple to an electronic system, or associated structure, comprising the multiple electronic components to be cooled.

9. The cooling assembly of claim 6, wherein the multiple coolant-cooled heat sinks comprises a metal material, and the multiple flexible coolant conduits comprise a flexible, insulative material.

10. A cooled electronic system comprising:
an electronic system comprising multiple electronic components to be cooled; and
a cooling assembly associated with the electronic system, the cooling assembly comprising:
multiple coolant-cooled heat sinks coupled to the multiple electronic components to be cooled;
multiple flexible coolant conduits coupled in fluid communication with the multiple coolant-cooled heat sinks to facilitate flow of liquid coolant therethrough;
a pivotable coolant supply manifold and a pivotable coolant return manifold, the pivotable coolant supply manifold and pivotable coolant return manifold being pivotably movable between a respective first position and a second position, wherein the multiple flexible coolant conduits couple in fluid communication the pivotable coolant supply manifold to the multiple coolant-cooled heat sinks and couple in fluid communication the multiple coolant-cooled heat sinks to the pivotable coolant return manifold to facilitate flow of liquid coolant through the multiple coolant-cooled heat sinks, the multiple flexible coolant conduits accommodating pivoting of the pivotable coolant supply manifold and the pivotable coolant return manifold between their respective first position and second position; and
wherein the respective first position of the pivotable coolant supply and return manifolds is laterally offset from at least one coolant-cooled heat sink of the multiple coolant-cooled heat sinks, and the respective second position of the pivotable coolant supply and return manifolds is above the at least one coolant-cooled heat sink, wherein in the first position of the pivotable coolant supply manifold and pivotable coolant return manifold, access to the at least one coolant-cooled heat sink is accommodated.

11. The cooled electronic system of claim 10, wherein the multiple flexible coolant conduits are bent with the pivotable coolant supply manifold and pivotable coolant return manifold in their respective first position, and are straighter with the pivotable coolant supply manifold and pivotable coolant return manifold in their respective second position.

12. The cooled electronic system of claim 10, further comprising a first pivot arm and a second pivot arm, the first pivot arm and the second pivot arm being disposed at opposite ends of the pivotable coolant supply manifold and opposite ends of the pivotable coolant return manifold, the first pivot arm and the second pivot arm facilitating pivotably moving together the pivotable coolant supply manifold and the pivotable coolant return manifold, and the first pivot arm and the second pivot arm being coupled to the electronic system.

13. The cooled electronic system of claim 12, wherein at least one of the first pivot arm or the second arm comprises a latch mechanism for latching the pivotable coolant supply manifold and pivotable coolant return manifold in at least one of the respective first position or second position.

14. The cooled electronic system of claim 12, wherein the first position of the pivotable coolant supply manifold and the pivotable coolant return manifold is laterally offset from at least one coolant-cooled heat sink of the multiple coolant-cooled heat sinks, and the second position of the pivotable coolant supply manifold and the pivotable coolant return manifold is aligned, at least in part, over the at least one coolant-cooled heat sink of the multiple coolant-cooled heat sinks.

15. The cooled electronic system of claim 10, wherein the multiple coolant-cooled heat sinks comprise a metal material, and the multiple flexible coolant conduits comprise a flexible, insulative material.

16. A method comprising:
providing a cooling assembly for facilitating cooling of at least one electronic component of an electronic system, the providing comprising:
providing at least one coolant-cooled heat sink to couple to the at least one electronic component to be cooled, one coolant-cooled heat sink of the at least one coolant-cooled heat sink comprising at least one coolant-carrying channel;
providing at least one flexible coolant conduit, one flexible coolant conduit of the at least one flexible coolant conduit being in fluid communication with the at least one coolant-carrying channel of the one coolant-cooled heat sink;
providing at least one pivotable coolant manifold, the one flexible coolant conduit coupling in fluid communication one pivotable coolant manifold of the at least one pivotable coolant manifold with the one coolant-cooled heat sink, and the one flexible coolant conduit accommodating pivoting of the one pivotable coolant manifold, while maintaining the one coolant-cooled heat sink in fluid communication with the one pivotable coolant manifold; and
wherein the at least one pivotable coolant manifold pivots between a first position laterally offset from the one coolant-cooled heat sink and a second position above the one coolant-cooled heat sink, and in the first position, when the cooling assembly is operatively associated with the at least one electronic component, access to the one coolant-cooled heat sink is accommodated.

17. The method of claim 16, further comprising providing a first pivot arm and a second pivot arm disposed at opposite of the at least one pivotable coolant manifold and facilitating pivotable movement of the at least one pivotable coolant manifold between a first position laterally offset from the one coolant-cooled heat sink and a second position above the one coolant-cooled heat sink.

\* \* \* \* \*